United States Patent
Voegeli (10) Patent No.: US 10,218,366 B1
(45) Date of Patent: Feb. 26, 2019

(54) PHASE LOCKED LOOP CALIBRATION FOR SYNCHRONIZING NON-CONSTANT FREQUENCY SWITCHING REGULATORS

(71) Applicant: Linear Technology Holding LLC, Norwood, MA (US)

(72) Inventor: Benjamin Thomas Voegeli, South Burlington, VT (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 15/823,477

(22) Filed: Nov. 27, 2017

(51) Int. Cl.
  H03L 7/06   (2006.01)
  H03L 7/10   (2006.01)
  H03L 7/18   (2006.01)
  H03L 7/093  (2006.01)
  H03L 7/089  (2006.01)

(52) U.S. Cl.
  CPC ............ H03L 7/10 (2013.01); H03L 7/0893 (2013.01); H03L 7/093 (2013.01); H03L 7/18 (2013.01)

(58) Field of Classification Search
  CPC ........ A61M 2230/005; A61M 2230/42; A61M 2230/432; A61M 2230/205
  See application file for complete search history.

(56) References Cited

U.S. PATENT DOCUMENTS

| | | |
|---|---|---|
| 3,725,766 A | 4/1973 | Brown |
| 4,095,165 A | 6/1978 | Boros |
| 5,929,620 A | 7/1999 | Dobkin et al. |
| 6,348,780 B1 | 2/2002 | Grant |
| 6,476,589 B2 | 11/2002 | Umminger et al. |
| 7,782,036 B1 | 8/2010 | Wong et al. |
| 8,350,548 B2 | 1/2013 | Tang et al. |
| 9,203,301 B2 | 12/2015 | Tang et al. |
| 9,489,001 B2 | 11/2016 | Wang |
| 9,621,172 B1 | 4/2017 | Yu et al. |
| 2007/0139026 A1 | 6/2007 | Jiang |
| 2008/0036438 A1 | 2/2008 | Komiya |
| 2008/0197830 A1 | 8/2008 | Mehas et al. |
| 2008/0284524 A1 | 11/2008 | Kushiyama |
| 2010/0141233 A1 | 6/2010 | Kwok |
| 2012/0049821 A1 | 3/2012 | Hashiguchi et al. |
| 2012/0056654 A1 | 3/2012 | Lee et al. |
| 2013/0038300 A1 | 2/2013 | Yanagida |

(Continued)

OTHER PUBLICATIONS

"1.5A Boost DC/DC Converter with Phase-Locked Loop" LT1310, 2001, pp. 1-12, Linear Technology Corporation, Milpitas, USA.

(Continued)

*Primary Examiner* — Sibin Chen
(74) *Attorney, Agent, or Firm* — Schwegman Lundberg & Woessner, P.A.

(57) ABSTRACT

A calibration circuit for synchronizing a switching regulator includes a phase locked loop circuit to generate one or more control signals based on an output of the switching regulator. A digital calibration circuit provides a digital output signal based on the control signals from the phase locked loop circuit. A timer can provide switching pulses to the switching regulator based on the digital output signal and the control signals. The phase locked loop circuit can adjust the control signals based on a reference clock signal to synchronize a feedback signal of the switching regulator with the reference clock signal.

20 Claims, 4 Drawing Sheets

(56) References Cited

U.S. PATENT DOCUMENTS

2013/0342183 A1    12/2013  Fang et al.
2015/0280557 A1*   10/2015  Xue ..................... H02M 3/156
                                                       323/271

OTHER PUBLICATIONS

"Single Phase Step-Down DC/DC Controller with Digital Power System Management," LTC3883/LTC3883-1, 2015, pp. 1-112, Linear Technology Corporation, Milpitas, USA.

* cited by examiner

PHASE LOCKED LOOP CALIBRATION FOR SYNCHRONIZING NON-CONSTANT FREQUENCY SWITCHING REGULATORS

TECHNICAL FIELD

The present description relates generally to integrated circuits, and more particularly, to phase locked loop (PLL) calibration for synchronizing non-constant frequency switching regulators.

BACKGROUND

Almost all electronic devices use one or more voltage regulators to provide one or more specified DC voltages, for their intended operations, from a power source such as a battery. Among different types of voltage regulators, switching voltage regulators are particularly popular due to their higher efficiency. A switching voltage regulator may employ a switching element, such as a metal oxide semiconductor field-effect transistor (MOSFET) and an energy storage element including an inductor, a transformer or a capacitor between the source and the load. In a switching voltage regulator, the regulation may be performed by varying a duty cycle and/or a frequency of the switching element to control an output-to-input voltage ratio of the switching voltage regulator.

Switching voltage regulators can be constant frequency or non-constant frequency switching regulators. The non-constant switching regulators have faster transient response, compared to the constant frequency switching regulators, and can operate at a lower duty cycle. The non-constant switching regulators can achieve an approximately constant frequency operation through the use of a flexible one-shot timer (OST) that can control an ON-time of the switching element. The use of the OST enables operation at a rather low duty cycle that allows converting a high input voltage to a relatively low output voltage. The switching frequency, however, may still vary significantly due to second order effects in the switching regulator.

Many applications work with a number of parameters such as an input voltage (Vin), output voltage (Vout), switching frequency and the like, for which the OST has to be able to provide a wide range of pulse widths. For example, a buck regulator may need to support an ON-time within a range of about 25 ns to 2.5 µs. Supporting a broad range of pulse widths with a conventional voltage- or current-controlled OST may be challenging and may require a high OST gain. Providing a high OST gain may add jitter or may involve using a large low-pass filter, which increases cost. Therefore, it is desirable to cover a wide range of applications with a low phased locked loop (PLL) closed-loop gain.

SUMMARY OF THE DISCLOSURE

In one or more aspects, a calibration circuit for synchronizing a non-constant frequency switching regulator is provided. The calibration circuit includes a timer to provide switching pulses to the switching regulator and a phase locked loop including a digital calibration circuit. The digital calibration circuit can control a pulse width associated with the switching pulses. One or more input signals of the digital calibration circuit are based on a control input signal of the timer. The digital calibration circuit can provide a digital output signal to control at least one parameter of the timer.

In one or more embodiments, a method of synchronizing a switching regulator by employing a digital calibration circuit includes generating, by a phase detection circuit, one or more control signals based on an output of the switching regulator. The method further includes setting, by the digital calibration circuit, a pulse width of a timer circuit based on the generated control signals of the phase detection circuit. The generated control signals can be adjusted by the phase detection circuit based on a reference clock signal to adjust a frequency of the timer circuit. The generated control signals are adjusted until a duty cycle of the switching regulator is synchronized with the reference clock signal.

In yet one or more other embodiments, a power management system includes one or more switching regulators and a calibration circuit. The calibration circuit can synchronize at least one of the switching regulators using a phase locked loop. The calibration circuit includes a timer circuit for providing switching pulses to at least one of the switching regulators. A digital calibration circuit can control a pulse width associated with the switching pulses. The digital calibration circuit may receive two input signals that are based on a control input signal of the timer circuit, and can provide a digital output signal to control at least one parameter of the timer circuit.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

In one or more aspects of the subject technology, methods and configurations are described for phase locked loop (PLL) calibration for synchronization of non-constant frequency switching regulators. The subject technology controls an ON-time of a switching regulator (e.g., a buck regulator) such that the phase and frequency of a switching output signal of the switching regulator matches the phase and frequency of a reference clock. A digitally-controlled circuit initializes an ON-time of a switch to a predetermined value that is related to output and input voltages of the buck regulator and a switching frequency of the buck regulator, and a PLL makes fine adjustments to bring the phase and frequency of the switching output signal into alignment with the reference clock. The subject technology can support a wide range of pulse widths to cover a range of parameters across a variety of applications using a low PLL loop gain. For example, the disclosed solution can synchronize a buck regulator that supports ON-time values ranging from 15 ns to 2.5 µs.

Figure 1:
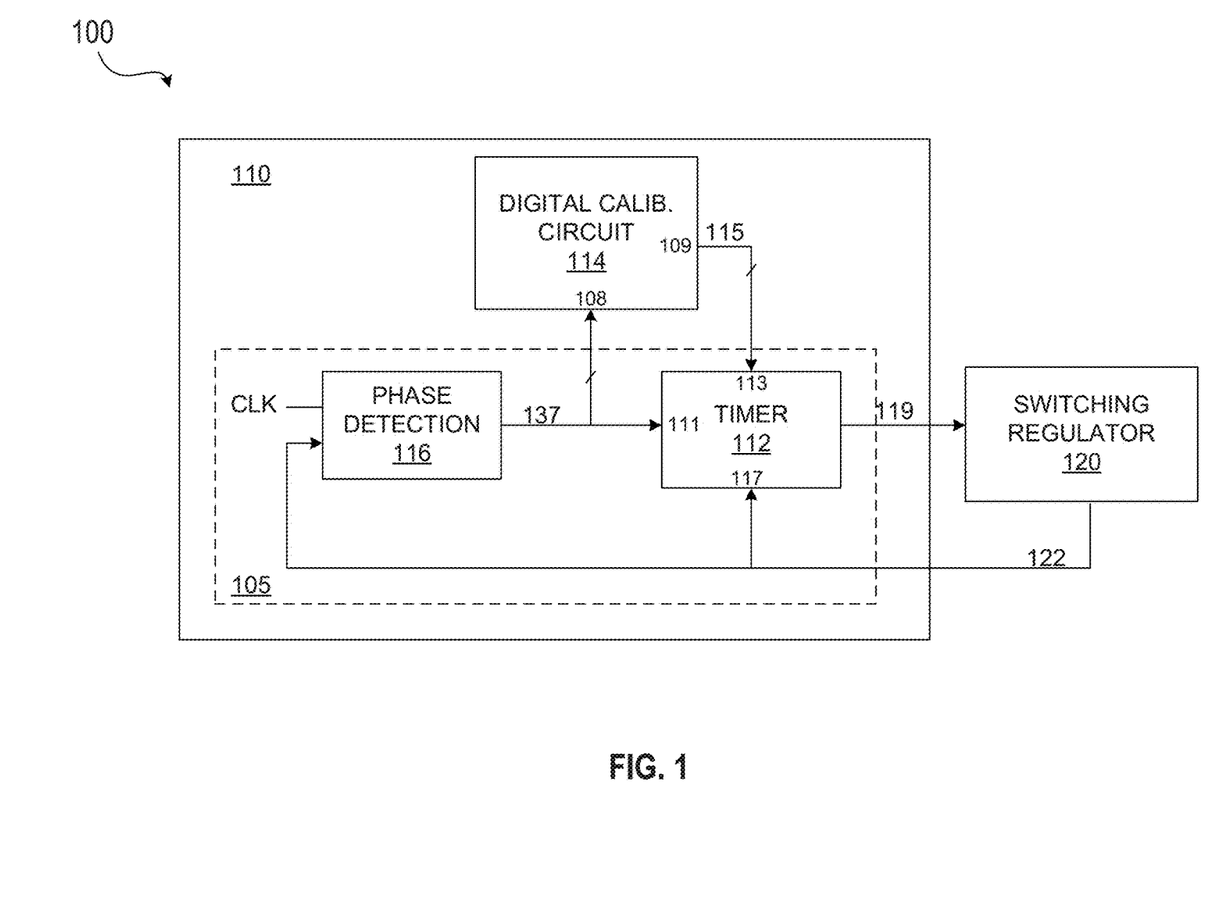
FIG. 1 is a high-level block diagram illustrating an example phase locked loop (PLL) calibrated switching regulator, according to aspects of the subject technology.

FIG. 1 is a high-level block diagram illustrating an example of a PLL calibrated switching regulator 100, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The PLL calibrated switching regulator 100 is a non-constant frequency switching regulator and includes a calibration circuit 110 and a switching regulator 120. The calibration circuit 110 can synchronize the switching regulator 120 with a reference clock signal CLK, for example, by matching a phase and a frequency of a switching signal of the switching regulator 120 with a phase and a frequency of the clock signal CLK. The calibration circuit 110 includes a digital calibration circuit 114 and a PLL circuit 105 including a timer 112, and a phase detection circuit 116. The timer 112 can be a one-shot timer (OST), and the phase detection circuit 116 can include a phase detector followed by a low-pass filter (LPF).

The switching regulator 120 can receive an unregulated DC voltage from a DC voltage supply and provide a regulated output voltage. In some implementations, the switching regulator can be a step-down (buck) regulator. In a buck regulator, a ratio of a value of the regulated DC voltage to a value of the unregulated DC voltage is determined by a duty cycle of a switch that couples the switching regulator 120 to the DC voltage supply. The timer 112 provides switching pulses 119 that control ON and OFF times of the switch. Therefore, the duty cycle of the switch is based on a timing of the switching pulses 119. The digital calibration circuit 114 controls the timer 112 by sending a digital output signal to a node 113 of the timer 112. In some implementations, the node 113 can be a port or a digital bus. The digital calibration signal (e.g., a digital word) controls the pulse width of switching pulses 119 provided by the timer 112, to be sent to switching regulator 120, based on a signal received at one or more input nodes 108.

The timer 112 and the phase detection circuit 116 receive a feedback signal 122 from the switching regulator 120. In some implementations, the feedback signal 122 may include duty cycle information or frequency information. The feedback signal 122 is received by an input node 117 of the timer 112, the signal of which is used to trigger the timer 112. At the phase detection circuit 116, the feedback signal 122 is compared with a clock (CLK) signal. The phase detection circuit 116 generates a voltage control signal 137 that is related to a phase difference between a phase of the feedback signal 122 and a phase of the CLK signal. The timer 112 receives the voltage control signal 137 at a first control input 111 and adjusts its frequency based on the voltage control signal 137. The digital calibration circuit 114 checks the voltage control signal 137, received at the input node 108, using a criterion and adjusts a digital calibration signal 115 based on the voltage control signal 137 passing the criterion. For example, the digital calibration circuit 114 may compare the voltage control signal 137 against a low and a high limit and adjust the digital calibration signal 115, based on a comparison result, as further described herein. In one or more implementations, digital calibration circuit 114 may use a known successive approximation algorithm or a known discrete-time filter to adjust the digital calibration signal 115 based on the voltage control signal 137.

Figure 2:
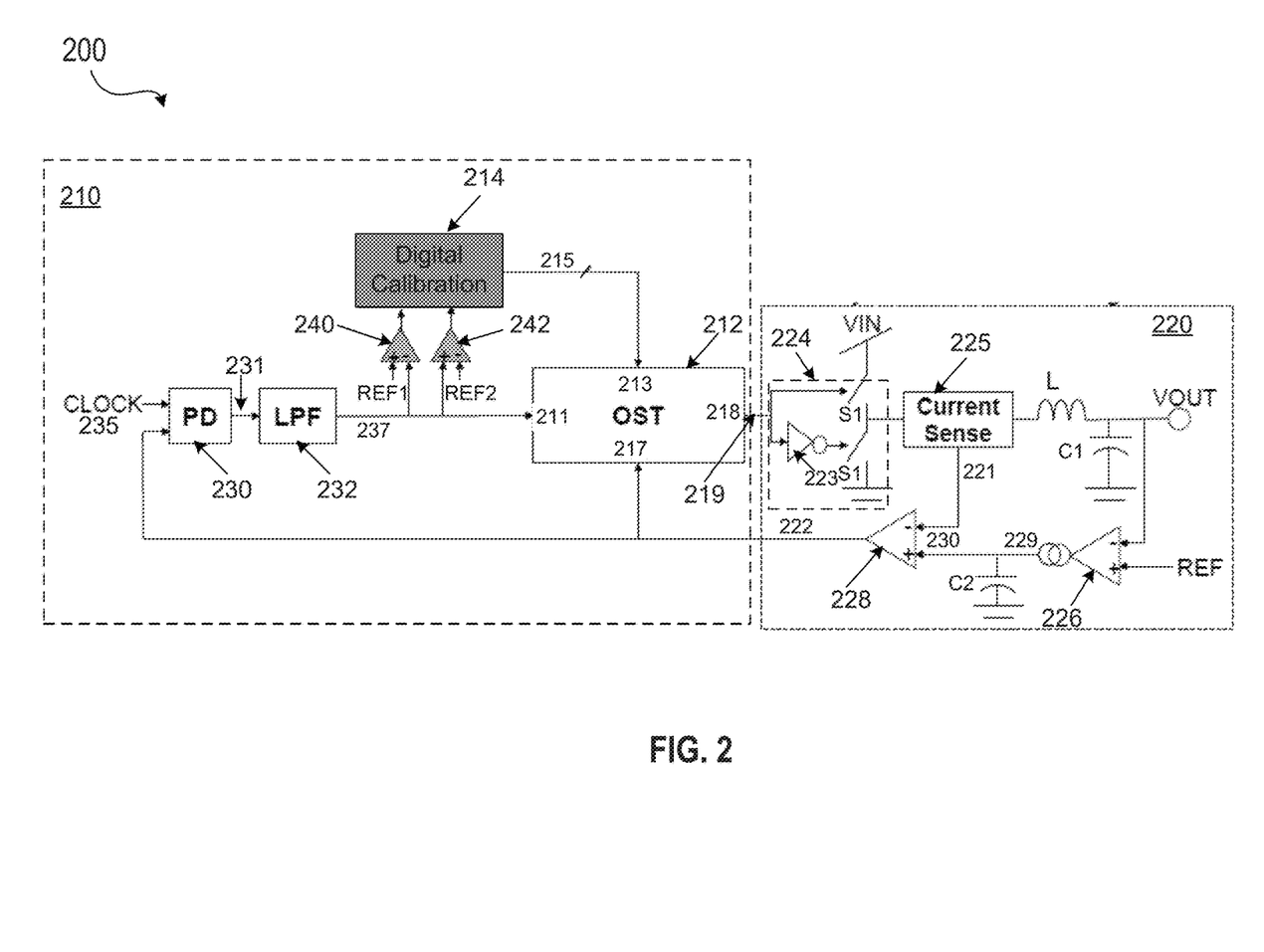
FIG. 2 is a schematic diagram illustrating an example implementation of a PLL calibrated switching regulator, according to aspects of the subject technology.

FIG. 2 is a schematic diagram illustrating an example implementation of a PLL calibrated switching regulator 200, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The PLL calibrated switching regulator 200 is non-constant frequency switching regulator and includes a calibration circuit 210 and a switching regulator 220. The calibration circuit 210 and the switching regulator 220 are example implementations of the calibration circuit 110 and the switching regulator 120 of FIG. 1. The calibration circuit 210 controls an ON-time of the switching regulator 220 such that the phase and frequency of a switching output signal of the switching regulator 220 at an output node of a switch circuit 224 matches the phase and frequency of a reference clock signal 235.

The calibration circuit 210 includes a digital calibration circuit 214, a timer circuit (also referred to as "timer") 212, a phase detector (PD) 230, a low-pass filter (LPF) 232 and comparators 240 and 242. In one or more implementations, the timer circuit 212 is a one-shot timer (OST, e.g., a 555 timer operated in monostable mode) that receives an input signal at an input node 211 and provides an output pulse 219 with a predetermined width at an output node 218. The digital calibration signal 215 is received at a node 213, and is used to adjust a width of the output pulse 219 of the timer circuit 212. The timing (e.g., a frequency) of the timer circuit 212 is controlled by a signal applied to an input node 211 (e.g., a voltage control node).

The PD 230 can compare a phase of a feedback signal 222 with a phase of a clock signal 235 and generate a phase error signal 231 based on a difference between the compared phases of the feedback signal 222 and the clock signal 235. The LPF 232 can smooth the error signal 231 to generate a voltage control signal 237, which is applied to the voltage control node 211 of the timer circuit 212.

In one or more implementations, the digital calibration circuit 214 is an up/down counter and the digital calibration signal 215 is a digital word (e.g., having between 4 to 8 bits). The digital calibration circuit 214 can adjust the digital word based on output signals of the comparators 240 and 242. The comparators 240 and 242 can compare the voltage control signal 237 with a first reference voltage (REF1, e.g., a $V_{min}$ such as ~1 V) and a second reference voltage (REF2, e.g., a $V_{max}$ such as ~2 V). For example, when voltage control signal 237 is less than $V_{min}$ (e.g., REF1), the frequency of the OST is decreased and the digital calibration circuit 214 may decrement the digital word to suitably increase the pulse width of the OST. On the other hand, when voltage control signal 237 is higher than $V_{max}$ (e.g., REF2), the frequency of the OST is increased and the digital calibration circuit 214 may increment the digital word to suitably decrease the pulse width of the OST. In one or more implementations, the digital calibration circuit 214 may use the known successive approximation algorithm or discrete-time filter to adjust the digital calibration signal 215 based on the voltage control signal 237. In one or more implementations, the digital calibration signal 215 may control a time offset, a frequency offset or a gain of the OST 212.

In some implementations, the switching regulator 220 is, but is not limited to, a buck (step-down) regulator, with a regulated output voltage smaller than an input DC supply. For example, the switching regulator 220 can be a boost (step-up) regulator that can provide a regulated output voltage that is larger than an input DC supply voltage. The switching regulator 220 (e.g., a buck regulator) includes the switch circuit 224, a current sensing circuit 225, an inductor L, a first capacitor C1, an error amplifier 226, a second capacitor C2 and a comparator 228. The switch circuit 224 includes switches S1 and S2 and an inverter 223. The switch circuit 224 can connect an input of the current sensing circuit 225 to the input DC supply voltage (e.g., VIN) or to a ground potential, depending on the status of switches S1 and S2. The status of switches S1 and S2 can be controlled by an output pulse 219 at an output node 218 of the timer circuit 212. For example, switches S1 and S2 may be switched simultaneously and complementary to each other by inverting the output pulse 219 for one of the switches. When the output pulse 219 is high, the switch S1 closes and connects the input DC supply voltage to the current sensing circuit 225. On the other hand, when the output pulse 219 is low, the inverter 223 inverts the output pulse 219 and triggers the switch S2 to close and connect the current sensing circuit 225 to the ground potential. Therefore, for the switching regulator 220, the duty cycle is set by the output pulse 219. The inductor L and the first capacitor C1 provide a load current and the regulated output voltage VOUT of the switching regulator 220, by their known operations.

The error amplifier 226 is a transconductance amplifier and can generate an output current 229 based on comparison of the output voltage VOUT with a reference voltage (REF). The output current 229 can charge the second capacitor C2 to provide a voltage signal 230. The voltage signal 230 is compared, by the comparator 228, with a current sensing voltage 221 of the current sensing circuit 225. The feedback signal 222 is generated by the comparator 228 based on a comparison of the voltage signal 230 and the current sensing voltage 221. The feedback signal 222 is high when the voltage signal 230 exceeds the current sensing voltage 221.

Figure 3:
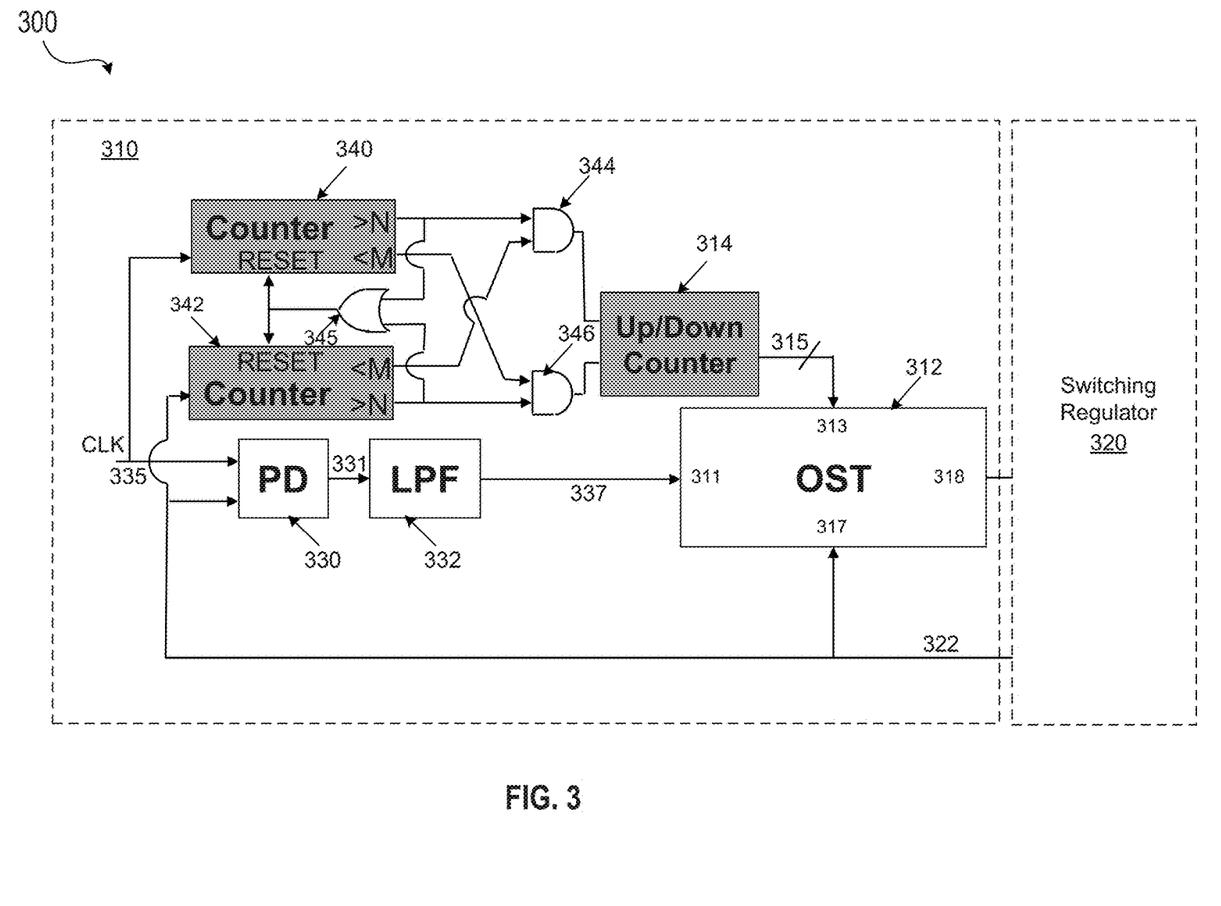
FIG. 3 is a schematic diagram illustrating an example PLL calibrated switching regulator using frequency counters, according to aspects of the subject technology.

FIG. 3 is a schematic diagram illustrating an example PLL calibrated switching regulator 300 using frequency counters, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The PLL calibrated switching regulator 300 is a non-constant frequency switching regulator and includes a calibration circuit 310 and a switching regulator 320. The calibration circuit 310 is an example implementation of the calibration circuit 110 of FIG. 1. The calibration circuit 310 controls an ON-time of the switching regulator 320 such that the phase and frequency of a switching output signal of the switching regulator 120 matches the phase and frequency of a reference clock 335. The calibration circuit 310 includes a digital calibration circuit 314, a timer circuit (also referred to as "timer") 312, a PD 330, an LPF 332, frequency counters 340 and 342, logic AND gates 344 and 346 and a logic OR gate 345.

In one or more implementations, the timer circuit 312 is similar to the timer circuit 212 of FIG. 2 and can be a one-shot timer (OST, e.g., a 555 timer). The timer circuit 312 receives an input signal at an input node (e.g., voltage control node) 311 and provides an output pulse with a predetermined width at an output node 318. The digital calibration signal 315 is received at a node 313, and is used to adjust the predetermined width of an output pulse of the timer circuit 312. The frequency of the timer circuit 312 is controlled by a signal applied to the voltage control node 311. The PD 330 and the LPF 332 are similar to the PD 230 and the LPF 232 of FIG. 2. For example, the PD 230 can compare a phase of a feedback signal 322 with a phase of the clock signal 335 and generate a phase error signal 331 based on a difference of the compared phases of the feedback signal 322 and the clock signal 335. The LPF 332 can smooth the error signal 331 to generate a voltage control signal 337, which is applied to the voltage control node 311 of the timer circuit 312.

In one or more implementations, the digital calibration circuit 314 is an up/down counter and the digital calibration signal 315 is a digital calibration word (e.g., having between 4 to 8 bits). The digital calibration circuit 314 can adjust the digital word based on digital outputs of the AND gates 344 and 346, which are based on frequencies of the feedback signal 322 and the clock signal 335, as discussed herein.

The frequency counters 340 and 342 can measure an input frequency such as the frequency of the clock signal 335 ($f_{CLK}$) and an output frequency such as a frequency of the feedback signal 322 ($f_{DCL}$). Respective digital outputs of the frequency counters 340 and 342 are coupled to logic AND gates 344 and 346, such that the logic AND gate 344 triggers when $f_{CLK}$ is greater than a first predetermined value N and $f_{DCL}$ has not yet reached a second predetermined value M (M≤N). In other words, the logic AND gate 344 triggers when $f_{CLK}$ is higher (e.g., faster) than $f_{DCL}$ by a factor of ~N/M. Once the logic AND gate 344 triggers, the up/down counter increments the digital calibration signal 315 (e.g., the digital calibration word) to increase the ON-time of the timer circuit 312. Similarly, the logic AND gate 346 triggers when $f_{DCL}$ is higher (e.g., faster) than $f_{CLK}$ by a factor of ~N/M. Once the logic AND gate 346 triggers, the up/down counter decrements the digital calibration signal 315 (e.g., the digital calibration word) to reduce the ON-time of the timer circuit 312. When $f_{DCL}$ and $f_{CLK}$ are within a ratio (N/M) of each other, no action is taken, and the analog portion of the PLL (e.g., including PD 330, LPF 332 and the timer circuit 312) is allowed to operate in a normal operating condition. Both frequency counter 340 or 342 are reset by a digital output of the logic OR gate 345, when either of frequency counter 340 or 342 exceeds N. In one or more implementations, the digital calibration signal 315 may control a time offset, a frequency offset or a gain of the OST 312.

Figure 4:
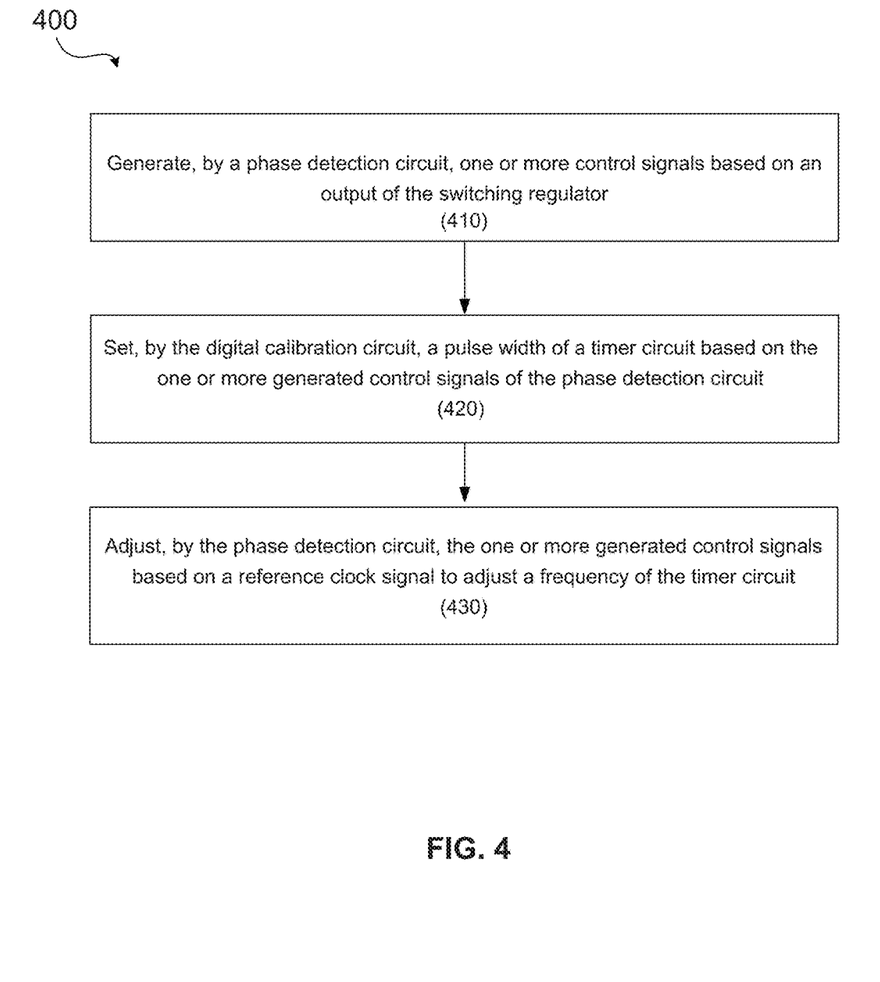
FIG. 4 is flow diagram illustrating an example method of synchronizing a switching regulator by employing a digital calibration circuit, according to aspects of the subject technology.

FIG. 4 is a flow diagram illustrating a method 400 of synchronizing a switching regulator by employing a digital calibration circuit, according to aspects of the subject technology. For explanatory purposes, the method 400 is primarily described herein with reference to the PLL calibrated switching regulator 100 of FIG. 1. However, the method 400 is not limited to the PLL calibrated switching regulator 100, and one or more blocks (or operations) of the method 400 may be performed by one or more other components of the PLL calibrated switching regulator 100. Further for explanatory purposes, the blocks of the example method 400 are described herein as occurring in serial, or linearly. However, multiple blocks of the example method 400 may occur in parallel. In addition, the blocks of the example method 400 need not be performed in the order shown and/or one or more of the blocks of the example method 400 need not be performed. The method 400 may be applied only once (e.g.

at system initialization), repeated a number of times (e.g., periodically during operation), or applied continuously during operation.

The method 400 includes generating, by a phase detection circuit (e.g., 116 of FIG. 1), one or more control signals (e.g., 137 of FIG. 1) based on an output of the switching regulator (e.g., 120 of FIG. 1) (410). The method 400 further includes setting, by the digital calibration circuit (e.g., 114 of FIG. 1), a pulse width of a timer circuit (e.g., 112 of FIG. 1) based on the one or more generated control signals (e.g., 137 of FIG. 1) of the phase detection circuit (420). The one or more generated control signals can be adjusted, by the phase detection circuit, based on a reference clock signal (e.g., CLK of FIG. 1) to adjust a frequency of the timer circuit (430). The one or more generated control signals are adjusted until the switching regulator is synchronized with the reference clock signal.

In summary, the subject technology supports PLL calibration for synchronizing non-constant frequency switching regulators. The disclosed technology controls the ON-time of a buck regulator such that the phase and frequency of the switching output matches the phase and frequency of a reference clock. A calibration circuit of the subject technology includes a timer to provide switching pulses to the switching regulator and a phase locked loop including a digital calibration circuit. The digital calibration circuit can control a pulse width associated with the switching pulses. One or more input signals of the digital calibration circuit are based on a control input signal of the timer. The digital calibration circuit can provide a digital output signal to control at least one parameter of the timer.

In one or more implementations, the digital calibration circuit includes an up-down counter, and the digital output signal of the digital calibration circuit includes a digital calibration word. The digital calibration circuit may generate the digital output signal when the one or more input signals are within a predetermined range.

In some implementations, the phase locked loop further includes a phase detector coupled to a low-pass filter (LPF), and the one or more input signals of the digital calibration circuit are derived from an output signal of the LPF. The switching regulator may be a non-constant frequency switching regulator, and a feedback signal of the switching regulator can be fed back to the phase detector and to an input node of the timer.

In one or more implementations, the digital calibration circuit can employ a successive approximation algorithm or a discrete-time filter.

In some implementations, the digital calibration circuit includes one or more frequency counters, and the frequency counters can directly measure an input frequency and an output frequency. The frequency counters can facilitate adjusting a digital calibration word when a ratio of the output frequency to the input frequency reaches a predetermined value.

In one or more implementations, the timer is a one-shot timer (OST), and the at least one parameter of the timer is a time offset, a frequency offset or a gain of the OST.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A calibration circuit for synchronizing a switching regulator, the circuit comprising:
   a phase locked loop circuit configured to generate one or more control signals based on an output of the switching regulator;
   a digital calibration circuit configured to provide a digital output signal comprising a plurality of bits based on the one or more control signals from the phase locked loop circuit; and
   a timer configured to provide, to the switching regulator, one or more switching pulses having a width that is set based on a value represented by the plurality of bits, wherein the phase locked loop circuit is configured to adjust the one or more control signals based on a reference clock signal to synchronize a feedback signal of the switching regulator with the reference clock signal.

2. The circuit of claim 1, wherein the digital calibration circuit comprises an up-down counter, and the digital output signal of the digital calibration circuit comprises a digital calibration word, wherein the up-down counter is configured to increment or decrement the digital calibration word based on the one or more control signals.

3. The circuit of claim 2, wherein the digital calibration circuit is configured to generate the digital output signal when the one or more control signals are within a predetermined range.

4. The circuit of claim 1, wherein the phase locked loop circuit includes a phase detector coupled to a low-pass filter (LPF), and the one or more control signals of the digital calibration circuit comprise an output signal of the LPF.

5. The circuit of claim 4, wherein the switching regulator comprises one of a non-constant frequency buck regulator or a non-constant frequency boost regulator, and wherein the feedback signal of the switching regulator is fed back to the phase detector and to an input node of the timer.

6. The circuit of claim 1, wherein the digital calibration circuit is configured to employ a successive approximation algorithm or a discrete-time filter to adjust the digital output signal based on the one or more control signals.

7. The circuit of claim 1, wherein the digital calibration circuit comprises one or more frequency counters, and wherein the one or more frequency counters are configured to directly measure an input frequency and an output frequency respectively corresponding to the reference clock signal and the feedback signal.

8. The circuit of claim 7, wherein the one or more frequency counters are configured to facilitate adjusting a digital calibration word when a ratio of the output frequency to the input frequency exceeds a predetermined value, wherein the digital calibration word is configured to control the pulse width of the switching pulses by adjusting a frequency of the timer circuit.

9. The circuit of claim 8, wherein the timer comprises a one-shot timer (OST), and the at least one parameter of the timer circuit comprises at least one of a time offset, a frequency offset or a gain of the OST.

10. A method of synchronizing a switching regulator by employing a digital calibration circuit, the method comprising:
generating, by a phase detection circuit, one or more control signals based on an output of the switching regulator;
setting, by the digital calibration circuit, a pulse width of a timer circuit by providing to the timer circuit a digital output signal comprising a plurality of bits based on the one or more generated control signals of the phase detection circuit; and
adjusting, by the phase detection circuit, the one or more generated control signals based on a reference clock signal to adjust a frequency of the timer circuit, wherein the one or more generated control signals are adjusted until the switching regulator is synchronized with the reference clock signal.

11. The method of claim 10, wherein the digital calibration circuit comprises an up-down counter, and the method further comprises providing, by the up-down counter, a digital calibration word to the timer circuit to set the pulse width of the timer circuit.

12. The method of claim 11, further comprising filtering the one or more generated control signals by using a low-pass filter (LPF).

13. The method of claim 12, further comprising providing the one or more filtered control signals at one or more input nodes of the digital calibration circuit.

14. The method of claim 12, wherein the switching regulator comprises a non-constant frequency switching regulator, and the output of the switching regulator comprises a feedback signal of the switching regulator.

15. The method of claim 14, further comprising receiving, at an input node of the timer circuit, the feedback signal of the switching regulator.

16. The method of claim 10, further comprising adjusting, by the digital calibration circuit, a digital output signal of the digital calibration circuit based on the one or more control signals by employing at least one of a successive approximation algorithm or a discrete-time filter.

17. The method of claim 10, wherein the digital calibration circuit includes one or more frequency counters, and the method further comprises directly measuring, by the one or more frequency counters, an input frequency and an output frequency respectively corresponding to the reference clock signal and the feedback signal.

18. The method of claim 17, further comprising facilitating adjusting, by the one or more frequency counters, a digital calibration word when a ratio of the output frequency to the input frequency exceeds a predetermined value, and adjusting using the digital calibration word, setting of the pulse width of the timer circuit.

19. A power management system, the system comprising:
one or more switching regulators; and
a calibration circuit configured to synchronize at least one of the one or more switching regulators, the calibration circuit comprising:
a phase locked loop circuit configured to generate one or more control signals based on an output signal of the at least one of the one or more switching regulators;
a digital calibration circuit configured to provide a digital output signal comprising a plurality of bits based on the one or more control signals from the phase locked loop circuit; and
a timer configured to provide, to the at least one of the one or more switching regulators, one or more switching pulses having a width that is set based on a value represented by the plurality of bits, wherein the phase locked loop circuit is configured to adjust the one or more control signals based on a reference clock signal to synchronize a feedback signal of the at least one of the one or more switching regulators with the reference clock signal.

20. The system of claim 19, wherein the digital calibration circuit comprises a frequency counter, and wherein the frequency counter is configured to directly measure an input frequency and an output frequency respectively corresponding to the reference clock signal and the feedback signal, and to adjust the digital output signal when the output frequency deviates from the input frequency by a predetermined threshold.

* * * * *